(12) United States Patent
Chen et al.

(10) Patent No.: US 12,489,066 B2
(45) Date of Patent: Dec. 2, 2025

(54) ELECTROMAGNETIC INTERFERENCE SHIELDING PACKAGE STRUCTURES AND FABRICATING METHODS THEREOF

(71) Applicant: Yangtze Memory Technologies Co., Ltd., Hubei (CN)

(72) Inventors: Peng Chen, Hubei (CN); HouDe Zhou, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 590 days.

(21) Appl. No.: 17/847,327

(22) Filed: Jun. 23, 2022

(65) Prior Publication Data
US 2022/0392849 A1 Dec. 8, 2022

Related U.S. Application Data

(63) Continuation of application No. PCT/CN2021/098772, filed on Jun. 8, 2021.

(51) Int. Cl.
| | |
|---|---|
| *H01L 23/552* | (2006.01) |
| *H01L 21/56* | (2006.01) |
| *H01L 23/00* | (2006.01) |
| *H01L 23/31* | (2006.01) |
| *H01L 25/00* | (2006.01) |
| *H01L 25/18* | (2023.01) |

(52) U.S. Cl.
CPC ............ *H01L 23/552* (2013.01); *H01L 21/56* (2013.01); *H01L 23/3128* (2013.01);
(Continued)

(58) Field of Classification Search
CPC ... H01L 23/552; H01L 21/56; H01L 23/3128; H01L 24/05; H01L 24/48; H01L 24/73;
(Continued)

(56) References Cited

U.S. PATENT DOCUMENTS

| | | |
|---|---|---|
| 7,566,962 B2 | 7/2009 | Kim |
| 7,898,066 B1 | 3/2011 | Scanlan et al. |

(Continued)

FOREIGN PATENT DOCUMENTS

| | | |
|---|---|---|
| CN | 101183677 A | 5/2008 |
| CN | 101188225 A | 5/2008 |

(Continued)

OTHER PUBLICATIONS

International Search Report of the International Searching Authority directed to related International Patent Application No. PCT/CN2021/098772, mailed Feb. 24, 2022; 5 pages.
(Continued)

*Primary Examiner* — Mark W Tornow
(74) *Attorney, Agent, or Firm* — Hanley, Flight & Zimmerman, LLC

(57) ABSTRACT

The present disclosure provides a semiconductor structure, comprising a die/die stack attached on a substrate, a conductive top block covering a top surface of the die/die stack, and a plurality of ground wires conductively connect the conductive top block and to the substrate. The conductive top block, the plurality of ground wires, and the substrate form a Faraday cage to provide an electromagnetic interference shielding of the die/die stack.

17 Claims, 6 Drawing Sheets

(52) U.S. Cl.
CPC .............. *H01L 24/05* (2013.01); *H01L 24/48* (2013.01); *H01L 24/73* (2013.01); *H01L 24/92* (2013.01); *H01L 25/18* (2013.01); *H01L 25/50* (2013.01); *H01L 2224/0233* (2013.01); *H01L 2224/04042* (2013.01); *H01L 2224/32145* (2013.01); *H01L 2224/32225* (2013.01); *H01L 2224/48147* (2013.01); *H01L 2224/48225* (2013.01); *H01L 2224/73265* (2013.01); *H01L 2224/92247* (2013.01)

(58) Field of Classification Search
CPC ......... H01L 24/92; H01L 25/18; H01L 25/50; H01L 2224/0233; H01L 2224/04042; H01L 2224/32145; H01L 2224/32225; H01L 2224/48147; H01L 2224/48225; H01L 2224/73265; H01L 2224/92247; H01L 24/29; H01L 24/49; H01L 24/83; H01L 24/32; H01L 2224/05554; H01L 2224/32245; H01L 2224/48091; H01L 2224/49052; H01L 2224/49175; H01L 2224/83191; H01L 2924/19107; H01L 25/0652; H01L 25/0657; H01L 2224/48145; H01L 2224/48227; H01L 2225/06506; H01L 2225/0651; H01L 2225/06537; H01L 2225/06562; H01L 2225/06586; H01L 2924/00014; H01L 2924/15311; H01L 2924/181; H01L 2924/3025; H01L 25/16
See application file for complete search history.

(56) References Cited

U.S. PATENT DOCUMENTS 8,049,119 B2    11/2011    Beddingfield et al.
2008/0087987 A1*    4/2008    Wang ................. B81B 7/0064
                                                                    257/659
2008/0237820 A1    10/2008    Kim et al.
2012/0241979 A1    9/2012    Choi et al.
2018/0166363 A1*    6/2018    Heppner ............. H01L 21/768
2021/0035919 A1*    2/2021    Tsai .................... H01L 23/3121

FOREIGN PATENT DOCUMENTS

CN    101919053 A    12/2010
CN    102969303 A    3/2013
CN    112397498 A    2/2021

OTHER PUBLICATIONS

The State Intellectual Property Office of People's Republic of China, "First Office Action and Search Report," issued in connection with Chinese Patent Application No. 202180001890.6, mailed on Jun. 30, 2023, 16 pages. [English language machine translation included.].

International Searching Authority, "International Preliminary Report on Patentability," issued in connection with International Patent Application No. PCT/CN2021/098772, mailed on Nov. 21, 2023, 4 pages.

The State Intellectual Property Office of People's Republic of China, "Second Office Action," issued in connection with Chinese Patent Application No. 202180001890.6, mailed on Mar. 16, 2024, 11 pages. [English language machine translation included.].

Lin et al., "Data Acquisition and Analysis Technology," Xi'an University of Electronic Science and Technology Press, Jul. 2005, pp. 146-148, 6 pages. [English machine translation included.].

The State Intellectual Property Office of People's Republic of China, "Decision on Rejection," issued in connection with Chinese Patent Application No. 202180001890.6, mailed on May 10, 2024, 18 pages. [English language machine translation included.].

* cited by examiner

ELECTROMAGNETIC INTERFERENCE SHIELDING PACKAGE STRUCTURES AND FABRICATING METHODS THEREOF

CROSS-REFERENCE TO RELATED APPLICATIONS

This application claims priority to PCT Application No. PCT/CN2021/098772, filed on Jun. 8, 2021, which is incorporated herein by reference in its entirety.

TECHNICAL FIELD

The present disclosure generally relates to the field of semiconductor technology, and more particularly, to electromagnetic interference shielding package structures and fabricating methods thereof.

BACKGROUND

Electronic devices generate unwanted radio frequencies (RF) that, when emitted from the device, can cause electromagnetic interference ("EMI") with other nearby electronic devices. The emission of unwanted EMI from electronic devices can interfere with the input/output broadcasting signals. In traditional semiconductor package structures, semiconductor chips are packaged by one or more substrates as the lead frame, and various mold compounds, etc. Generally, the one or more substrates include composite materials and the mold compounds include insulating materials, such as plastic or similar polymeric. The electronic devices on the semiconductor chips enclosed in the traditional semiconductor package structures offering little protection against EMI emission.

To minimize the emission of unwanted EMI emissions from the electronics disposed within the enclosure, EMI shielding is required on certain semiconductor devices in order to minimize EMI radiation from the semiconductor device. EMI shielding is further required to prevent EMI radiation from external sources from interfering with operation of the semiconductor device. Currently, the application frequency range of semiconductor devices becomes higher and higher, which requires higher EMI Shielding requirements.

Conventional methods of shielding electronic devices include enclosing the devices in metal cabinets, housings or cages, and coating the devices with metal coatings. Unfortunately, these methods add significant weight to the devices, increase fabrication costs, and may present corrosion problems in long term applications. It therefore would be useful to provide methods and structures for substantially shielding electronic devices, wherein the structures are relatively light, can be provided and incorporated into devices at relatively low cost while adding little weight to the device, and are corrosion resistant.

BRIEF SUMMARY

Embodiments of electromagnetic interference shielding package structures and fabricating methods thereof are described in the present disclosure.

One aspect of the present disclosure provides a semiconductor structure, comprising a first die/die stack attached on a substrate, a conductive top block covering a top surface of the first die/die stack. and a plurality of ground wires conductively connect the conductive top block and to the substrate. The conductive top block, the plurality of ground wires, and the substrate form a Faraday cage to provide an electromagnetic interference shielding of the first die/die stack.

In some embodiments, the plurality of ground wires are surrounding the first die/die stack.

In some embodiments, a size of the conductive top block is larger than a size of the first die/die stack in a plane substantially parallel to a major surface of the substrate, such that the top surface of the first die/die stack is completely covered by the conductive top block.

In some embodiments, the semiconductor structure further comprises a mold compound layer on the substrate and covering the conductive top block and the plurality of ground wires, and a plurality of solder balls attached to a bottom surface of the substrate.

In some embodiments, the conductive top block includes a conductive plate with a thickness between about 20 μm and about 100 μm, an insulating layer covering a top surface of the conductive plate, and a plurality of bond pads embedded in the insulating layer and in electrically contact with the conductive plate.

In some embodiments, the conductive plate is a metal plate or a conductive polymer plate doped with a metal or a metal oxide.

In some embodiments, the plurality of bond pads are located adjacent to all edges of the conductive top block, and have a thickness between about 0.5 μm and about 1 μm, and have a bond pad pitch between about 50 μm and about 5 mm.

In some embodiments, the conductive top block includes a conductive film on a top surface of a silicon wafer, wherein a thickness of the conductive film is in a range from about 1 μm to about 20 μm, an insulating layer covering a top surface of the conductive film, and a plurality of bond pads embedded in the insulating layer and in electrically contact with the conductive film.

In some embodiments, the conductive film is a metal film or a conductive ink film.

In some embodiments, the first die/die stack is attached to the substrate by a first adhesive film, and the conductive top block is attached to the top surface of the first die/die stack by a second adhesive film different from the first adhesive film.

In some embodiments, the first adhesive film is a die attach film, and the second adhesive film is a film over wire penetrated by a plurality of signal wires of the die/die stack.

In some embodiments, the semiconductor structure further comprises a second die/die stack without electromagnetic interference protection.

In some embodiments, the second die/die stack is located on a side of the first die/die stack in a lateral direction.

In some embodiments, the second die/die stack includes a three-dimensional NAND Flash device, and the first die/die stack includes a memory controller for controlling the three-dimensional NAND Flash device.

In some embodiments, the second die/die stack is located on a top surface of the conductive top block.

Another aspect of the present disclosure provides a method of forming a semiconductor structure, comprising: attaching a first die/die stack on a substrate; forming a conductive top block having a larger size of the first die/die stack; attaching the conductive top block to cover a top surface of the first die/die stack; and forming a plurality of ground wires conductively connect the conductive top block and the substrate, such that the conductive top block, the plurality of ground wires, and the substrate form a Faraday cage to provide an electromagnetic interference shielding of the first die/die stack.

In some embodiments, forming the plurality of ground wires comprising forming the plurality of ground wires surrounding the first die/die stack.

In some embodiments, the method further comprises: forming a mold compound layer on the substrate to cover the conductive top block and the plurality of ground wires; and attaching a plurality of solder balls to a bottom surface of the substrate.

In some embodiments, forming the conductive top block comprises: forming a conductive plate with a thickness between about 20 μm and about 100 μm; forming an insulating layer covering a top surface of the conductive plate; and forming a plurality of bond pads having a thickness between about 0.5 μm and about 1 μm embedded in the insulating layer and in electrically contact with the conductive plate.

In some embodiments, the method further comprises arranging the plurality of bond pads adjacent to all edges of the conductive top block, and having a bond pad pitch between about 50 μm and about 5 mm.

In some embodiments, the method further comprises: forming a conductive film having a thickness of the conductive film is in a range from about 1 μm to about 20 μm on a top surface of a silicon wafer by spin coating, spraying, plating, or sputtering; forming an insulating layer covering a top surface of the conductive film; and forming a plurality of bond pads having a thickness between about 0.5 μm and about 1 μm embedded in the insulating layer and in electrically contact with the conductive film.

In some embodiments, the method further comprises forming at least one signal wire connecting the first die/die stack to the substrate, wherein a portion of the at least one signal wire penetrates a second adhesive film for attaching the conductive top block.

In some embodiments, the method further comprises forming a second die/die stack located on a side of the first die/die stack in a lateral direction without electromagnetic interference protection.

In some embodiments, the method further comprises forming a second die/die stack located on a top surface of the conductive top block without electromagnetic interference protection.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
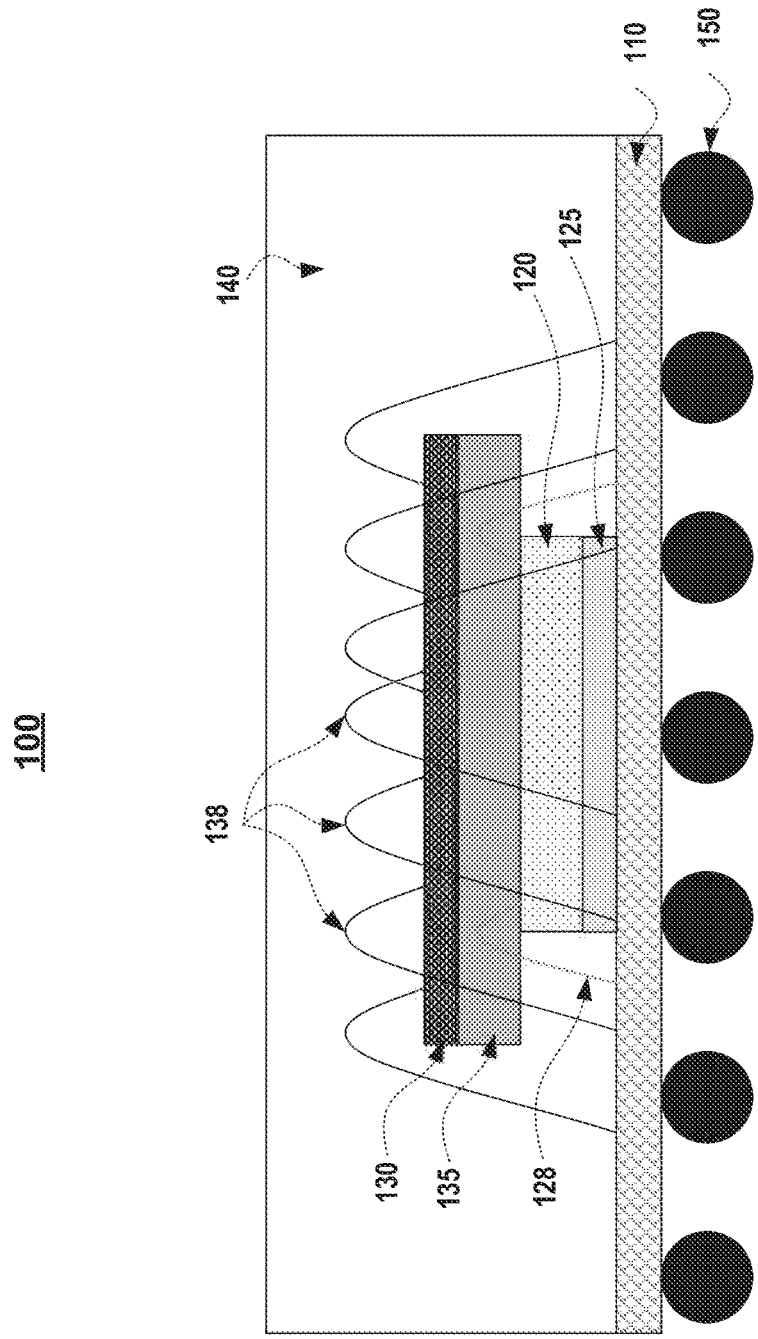
FIG. 1 illustrates a schematic diagram in a perspective side view of an exemplary semiconductor device structure, in accordance with some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The front surface of the substrate is typically where a semiconductor device is formed, and therefore the semiconductor device is formed at a top side of the substrate unless stated otherwise. The bottom surface is opposite to the front surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is adjacent to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

In the past, EMI shielding structure was generally accomplished in several ways. A first method was to attach a Faraday cage over the component after the component was attached to a substrate, such as a printed circuit board. The Faraday cage is formed by using wire bond technique. However, this approach has several problems. First, such Faraday cage has a high cost by consuming of precious metals such as gold, silver and copper. Second, the fabricating process has a slow speed to connect metal wires one by one. Third, some complicated integrated circuit (IC) layouts requires long wires to across chips which increases the difficulties of fabricating process.

Another method was to form a plating coating as an EMI film by sputtering or spraying conductive materials on the surface or part of surface of the package body. However, this approach also has several problems. First, the cost is high by requiring special expensive sputtering or spraying equipment, and precious metals (such as silver) as the conductive materials for sputtering or spraying. Second, the ground wire connection formed by connecting the exposed ground traces around the substrate has a risk of high contact resistance. Third, the surface of the plating coating is easily to be damaged and oxidized.

The present disclosure provides electromagnetic interference shielding package structures and fabricating methods thereof to address above issues. In some embodiments, the disclosed EMI shielding package structure can include a conductive block covering a top surface of the die or die stack that requires EMI protection. The conductive top block can be either a metal plate, or a silicon film with a conductive coating (plating) layer on the surface. Such conductive block can be formed by using mature fabricating processes with a low cost. The disclosed EMI shielding package structure can further include a plurality of ground wires electrically connecting the edges of the conductive top block and the base substrate or frame at a ground level. The ground wires can have a relatively short length to reduce the impact of contact resistance, and can be fabricated by using mature fabricating processes without special equipment. The conductive top block, the plurality of ground wires, and the base substrate or frame can form a Faraday cage to electromagnetically shield the die or die stack located within the Faraday cage. Since the Faraday cage is embedded within the package structure, it can be protected by mold compound layer of the package structure to avoid potential damages. Further, the disclosed EMI shielding package structure has a simple design and a low product cost.

Referring to FIG. 1, a schematic diagram in a perspective side view of an example semiconductor device structure is illustrated, in accordance with some embodiments of the present disclosure.

As show, the semiconductor device structure 100 can include a base substrate 110. The base substrate 110 can be any suitable semiconductor substrate having any suitable structure, such as a monocrystalline single-layer substrate, a polycrystalline silicon (polysilicon) single-layer substrate, a polysilicon and metal multi-layer substrate, etc.

A die/die stack 120 can be attached to the base substrate by a first adhesive film 125. In some embodiments, the die/die stack 120 can be any suitable semiconductor die/die stack that are sensitive to high frequency electromagnetic signals, such as input/output signals larger than 1 G Hz, thus requires EMI protection. The first adhesive film 125 can be any suitable die attach film (DAF).

The semiconductor device structure 100 can further include a conductive top block 130 attached to the top surface of the die/die stack 120 by a second adhesive film 135. As shown in FIG. 1, the size of conductive top block 130 can be a slightly larger than the size of die/die stack 120 in a plane substantially parallel to a major surface of the substrate. That is, the conductive top block 130 can completely cover the top surface of the die/die stack 120.

Figure 2A:
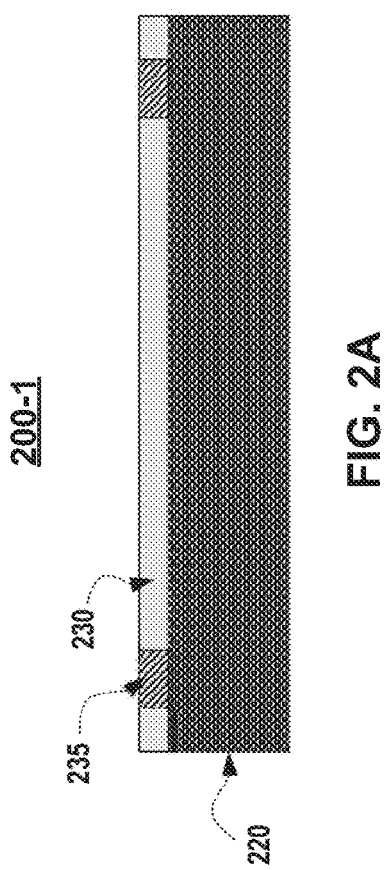
FIG. 2A illustrates a schematic diagram in a perspective side view of an exemplary conductive top block, in accordance with some embodiments of the present disclosure.
Figure 2B:
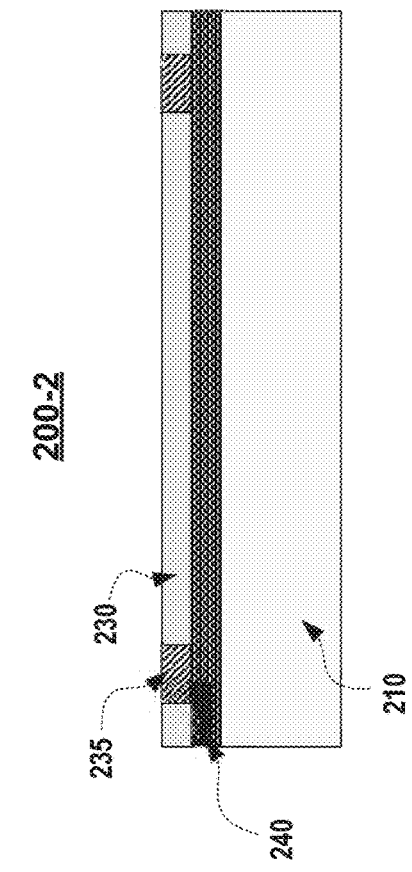
FIG. 2B illustrates a schematic diagram in a perspective side view of another exemplary conductive top block, in accordance with some embodiments of the present disclosure.
Figure 2C:
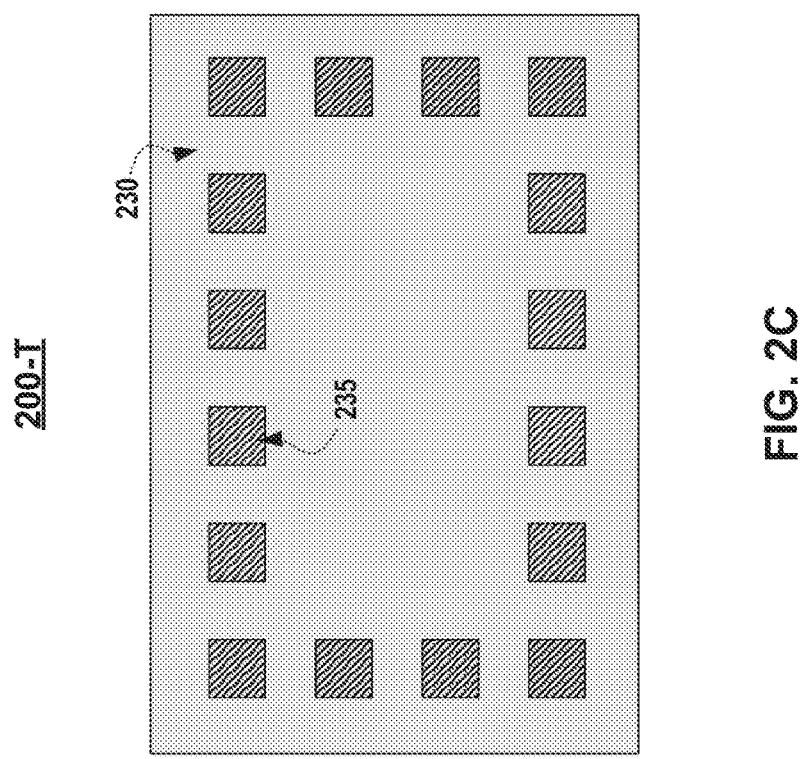
FIG. 2C illustrates a schematic diagram in a top view of an exemplary conductive top block, in accordance with some embodiments of the present disclosure.

Referring to FIGS. 2A and 2B, schematic diagrams in a perspective side view of exemplary conductive top blocks are illustrated, in accordance with some embodiments of the present disclosure. Referring to FIG. 2C, a schematic diagram in a top view of an exemplary conductive top block is illustrated, in accordance with some embodiments of the present disclosure.

In some embodiments as shown in FIG. 2A, the conductive top block 200-1 can include a conductive plate 220. The conductive plate 220 can include any suitable conductive materials, such as copper (Cu), nickel (Ni), gold (Au), silver (Ag), platinum (Pt), cobalt (Co), titanium (Ti), chrome (Cr), zirconium (Zr), molybdenum (Mo), ruthenium (Ru), hafnium (Hf), tungsten (W), rhenium (Re), graphite, carbon black, combinations thereof, and/or other materials known to those skilled in the art. In some embodiments, the conductive plate 220 can further include a binder to allow internal metal particles to be bonded to one another. In other embodiments, the conductive plate 220 can include a conductive polymer, such as polyacetylene, polyaniline, polypyrrole, polythiophene or poly sulfur nitride, which is doped with a metal or a metal oxide. A thickness of the conductive plate 220 can be in a range from about 20 micrometers (μm) to about 100 μm (e.g., 40 μm or 60 μm).

An insulating layer 230 can cover a top surface of the conductive plate 220. The insulating layer 230 can include any suitable dielectric materials, such as silicon dioxide (SiO$_2$) or silicon nitride (SiN$_x$). A plurality of bond pads (or contact pads, redistribution pads, or similar structures as known to those skilled in the art) 235 can be embedded in the insulating layer 230 and in electric contact with the conductive plate 220 to improve wire-bondability. A thickness of the bond pads 235 can be in a range from about 0.5 μm to about 1 μm (e.g., 0.8 μm). The plurality of bond pads 235 can be formed by a plating process or a sputtering process.

In some other embodiments as shown in FIG. 2B, the conductive top block 200-2 can include a silicon wafer 210 with a conductive film 240 on the top surface of the silicon wafer 210. In some embodiments, the conductive film 240 can be a metal film formed by spin coating, spraying, plating, sputtering, combination thereof, and/or other process techniques known to those skilled in the art. The conductive film 240 can include any suitable conductive materials, such as Cu, Ni, Au, Ag, Pt, Co, Ti, Cr, Zr, Mo, Ru, Hf, W, Re, graphite, carbon black, combinations thereof, and/or other materials known to those skilled in the art. In addition, the conductive film 240 can include a conductive ink prepared by mixing conductive materials, such as carbon black, graphite, silver, etc. A thickness of the conductive film 240 can be in a range from about 1 μm to about 20 μm (e.g., 5 μm or 10 μm).

Similarly, an insulating layer 230 can cover a top surface of the conductive film 240. The insulating layer 230 can include any suitable dielectric materials, such as silicon dioxide (SiO$_2$) or silicon nitride (SiN$_x$). Similarly, a plurality of bond pads 235 can be embedded in the insulating layer 230 and in electric contact with the conductive film 240 to improve wire-bondability. A thickness of the bond pads 235 can be in a range from about 0.5 μm to about 1 μm (e.g., 0.8 μm). The plurality of bond pads 235 can be formed by a plating process or a sputtering process.

As shown in FIG. 2C, the plurality of bond pads 235 can be located adjacent to all edges of the conductive top block. The bond pad pitch, which is defined by a distance between adjacent bond pads 235, can be pre-determined by electromagnetic signal frequency range which needs to be shielded. A smaller bond pad pitch can be used corresponding to a higher electromagnetic signal frequency range. In some embodiments, the bond pad pitch can be in a range from about 50 μm to about 5 millimeters (mm).

Referring back to FIG. 1, the semiconductor device structure 100 can further include a plurality of signal wires 128 electrically connecting the top surface of the die/die stack 120 and the base substrate 110. In some embodiments, the second adhesive film 135 can be any suitable film over wire (FOW), and the plurality of signal wires 128 can penetrate through the FOW as shown in FIG. 1.

In some embodiments, the semiconductor device structure 100 can further include a plurality of ground wires 138 conductively connecting the top surface of the conductive top block 130 and the base substrate 110. In some embodiments, each of the plurality of ground wires 138 can conductively connect to a corresponding one of the plurality of bond pads 235 described above in connection with FIGS. 2A-2C. Since the plurality of bond pads 235 are located adjacent to all edges of the conductive top block 130, as shown in FIG. 2C, the plurality of ground wires 138 can surround the conductive top block 130 and the die/die stack 120. The term surround is meant to indicate that the ground wires are disposed all side edges of the various layers 120, 125, 130 and 135. As such, the conductive top block 130, the plurality of ground wires 138, and the base substrate 110 can form a Faraday cage to electromagnetically enclose the die/die stack 120 that requires EMI protection.

Further, the semiconductor device structure 100 can include a mold compound layer 140 on the base substrate 110, such that the die/die stack 120, the conductive top block 130, the plurality of signal wires 128 and ground wires 138 are fully embedded within the mold compound layer 140 of the finished package. In some embodiments, the mold compound layer 140 can be a thermally curable epoxy mold compound or a thermally curable epoxy mold resin. For example, the mold compound layer 140 comprises an inorganic filler (for example, silica), an epoxy resin, a curing agent, a flame retardant, a curing promoter, a release agent, and any other suitable components as known to those skilled in the art. In some embodiments, a plurality of solder balls 150 can be attached to a bottom surface of the base substrate 110. It is noted that, the semiconductor device structure 100 can further include any other suitable components that are not shown in FIG. 1.

Figure 3:
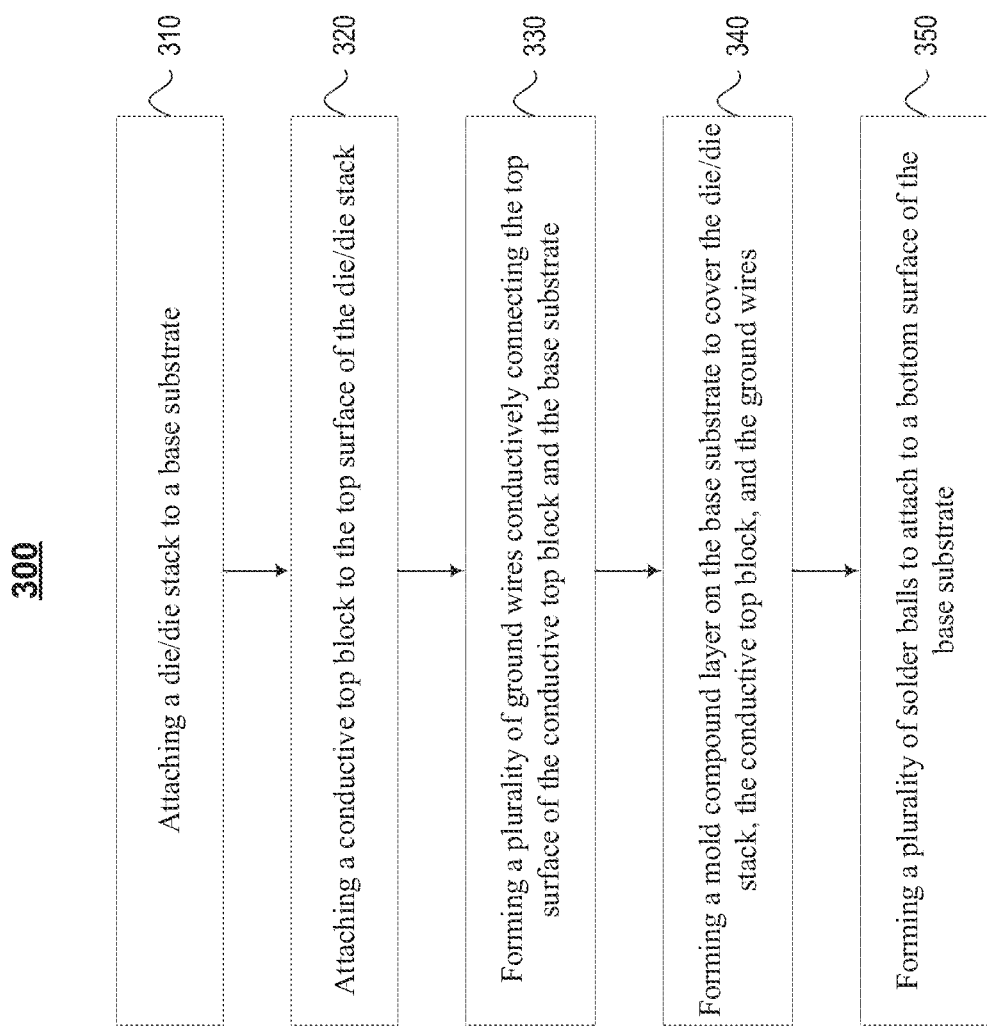
FIG. 3 illustrates a flow diagram of an exemplary method for forming an electromagnetic interference shielding package structure, in accordance to some embodiments of the present disclosure.

Referring to FIG. 3, a flow diagram of an exemplary method for forming an electromagnetic interference shielding package structure is illustrated in accordance to some embodiments of the present disclosure. It should be understood that the operations and/or steps shown in FIG. 3 are not exhaustive and that other operations can be performed as well before, after, or between any of the illustrated operations.

As shown in FIG. 3, the method 300 starts at operation 310, in which a die/die stack can be attached to a base substrate by using any suitable adhering or fastening means known in the art. In some embodiments as shown in FIG. 1, a first adhesive film 125, such as a die attach film (DAF), can be attached to a bottom surface of die/die stack 120. And then the die/die stack 120 can be permanently attached or secured to the top surface of the base substrate 110 through the DAF 125.

Method 300 can proceed to operation 320, in which a plurality of signal wires can be formed to electrically connect the die/die stack and the base substrate. It is noted that, FIG. 1 shows a single die as an example. In this example, the plurality of signal wires 128 are formed to connect a plurality of signal pads (not shown) respectively on the top surface of the die to the base substrates 110. In some other embodiments not shown in the FIG. 1, the die stack can include multiple layers of dies stacked in a vertical direction. In such cases, the plurality of signal wires 128 can include various groups of signal wires connect a plurality of signal pads and/or redistribution pads respectively on each layer of the die stack.

Referring back to FIG. 3, method 300 can proceed to operation 330, in which a conductive top block can be attached to the top surface of the die/die stack by using any suitable adhering or fastening means known in the art. The conductive top block can be either a conductive plate as shown in FIG. 2A, or a silicon wafer with a conductive film attached as shown in FIG. 2B. In some embodiments, the size of conductive top block can be a slightly larger than the size of die/die stack in the horizontal plane, such that the conductive top block can completely cover the top surface of the die/die stack.

In some embodiments, a process to form the conductive top block 200-1 as shown in FIG. 2A can include forming a conductive plate, forming an insulating layer covering a top surface of the conductive plate, and forming a plurality of bond pads in the insulating layer. The conductive plate can be formed by using any suitable conductive materials, such as Cu, Ni, Au, Ag, Pt, Co, Ti, Cr, Zr, Mo, Ru, Hf, W, Re, graphite, carbon black, or any suitable combinations thereof. A thickness of the formed conductive plate can be in a range from about 20 µm to about 100 µm, for example, the thickness of the formed conductive plate can be 40 µm or 70 µm. The insulating layer can be formed by using any suitable dielectric materials, such as silicon dioxide ($SiO_2$) or silicon nitride ($SiN_x$). The plurality of bond pads can be formed by a plating process or a sputtering process in the insulating layer and adjacent to all edges of the conductive top block. In some embodiments, a thickness of the formed bong pads can be in a range from about 0.5 µm to about 1 µm (e.g. 0.8 µm), and a bond pad pitch between adjacent bond pads can be in a range from about 50 µm to about 5 mm (e.g. 100 µm).

In some other embodiments, a process to form the conductive top block 200-2 as shown in FIG. 2B can include forming a conductive film 240 on a top surface of a silicon wafer 210, forming an insulating layer 230 covering a top surface of the conductive film 240, and forming a plurality of bond pads 235 in the insulating layer 240. The conductive film 240 can be formed by spin coating, spraying, plating, sputtering, or any other suitable process, and using any suitable conductive materials, such as Cu, Ni, Au, Ag, Pt, Co, Ti, Cr, Zr, Mo, Ru, Hf, W, Re, graphite, carbon black, or a conductive ink prepared by mixing above conductive materials, etc. A thickness of the formed conductive film can be in a range from about 1 µm to about 20 µm (e.g., 5 µm or 15 µm). The insulating layer 230 can be formed by using any suitable dielectric materials, such as silicon dioxide ($SiO_2$) or silicon nitride ($SiN_x$). The plurality of bond pads 235 can be formed by a plating process or a sputtering process in the insulating layer 230 and adjacent to all edges of the conductive top block. In some embodiments, a thickness of the formed bong pads 235 can be in a range from about 0.5 µm to about 1 µm, and a bond pad pitch between adjacent bond pads can be in a range from about 50 µm to about 5 mm.

In some embodiments as shown in FIG. 1, a second adhesive film 135, such as a film over wire (FOW), can be attached to a bottom surface of the conductive top block 130. And then the conductive top block 130 can be permanently attached or secured to the top surface of the die/die stack 120 through the FOW 135. A part of the signal wires 128 can partially penetrate or pass through the FOW 135.

Referring back to FIG. 3, method 300 can proceed to operation 330, in which a plurality of ground wires conductively connecting the top surface of the conductive top block and the base substrate. In some embodiments, each of the plurality of ground wires can be formed to conductively connect between a corresponding bond pad the top surface of the conductive top block and the base substrate. Since the plurality of bond pads can be arranged adjacent to all edges of the conductive top block as shown in FIG. 2C, the plurality of ground wires can be formed to surround the conductive top block and the die/die stack. As such, the conductive top block, the plurality of ground wires, and the base substrate can form a Faraday cage to electromagnetically enclose the die/die stack that requires EMI protection.

Method 300 can proceed to operation 340, in which a mold compound layer on the base substrate to cover the die/die stack, the conductive top block, the plurality of signal wires and ground wires. In some embodiments, the mold compound layer can be formed by any suitable materials, such as a thermally curable epoxy mold compound material or a thermally curable epoxy mold resin. For example, the mold compound layer can be formed by using an inorganic filler (e.g., silica), an epoxy resin, a curing agent, a flame retardant, a curing promoter, a release agent, and any other suitable components as known to those skilled in the art.

Method 300 can then proceed to operation 350, in which a plurality of solder balls can be formed to attach to a bottom surface of the base substrate.

Figure 4A:
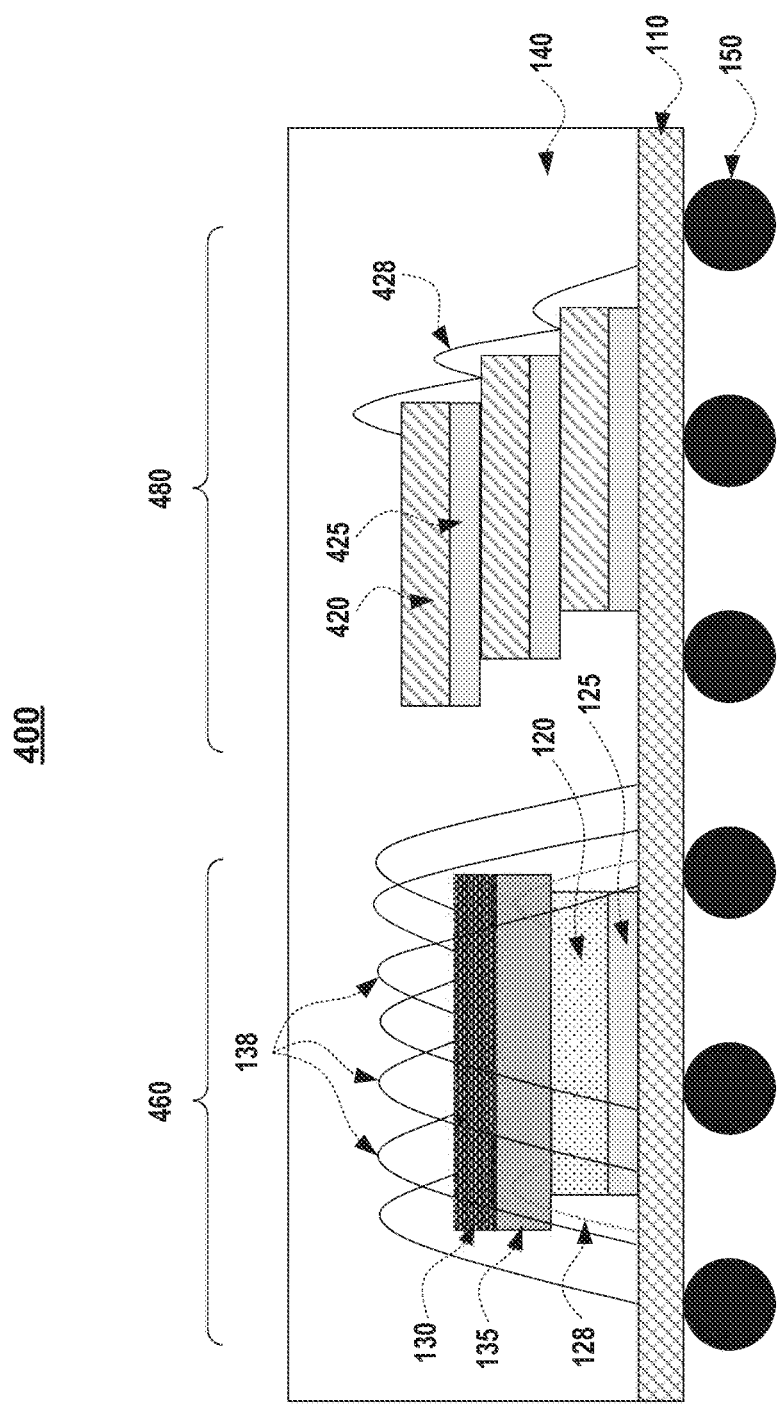
FIG. 4A illustrates a schematic diagram in a perspective side view of another exemplary semiconductor device structure, in accordance with some embodiments of the present disclosure.
Figure 4B:
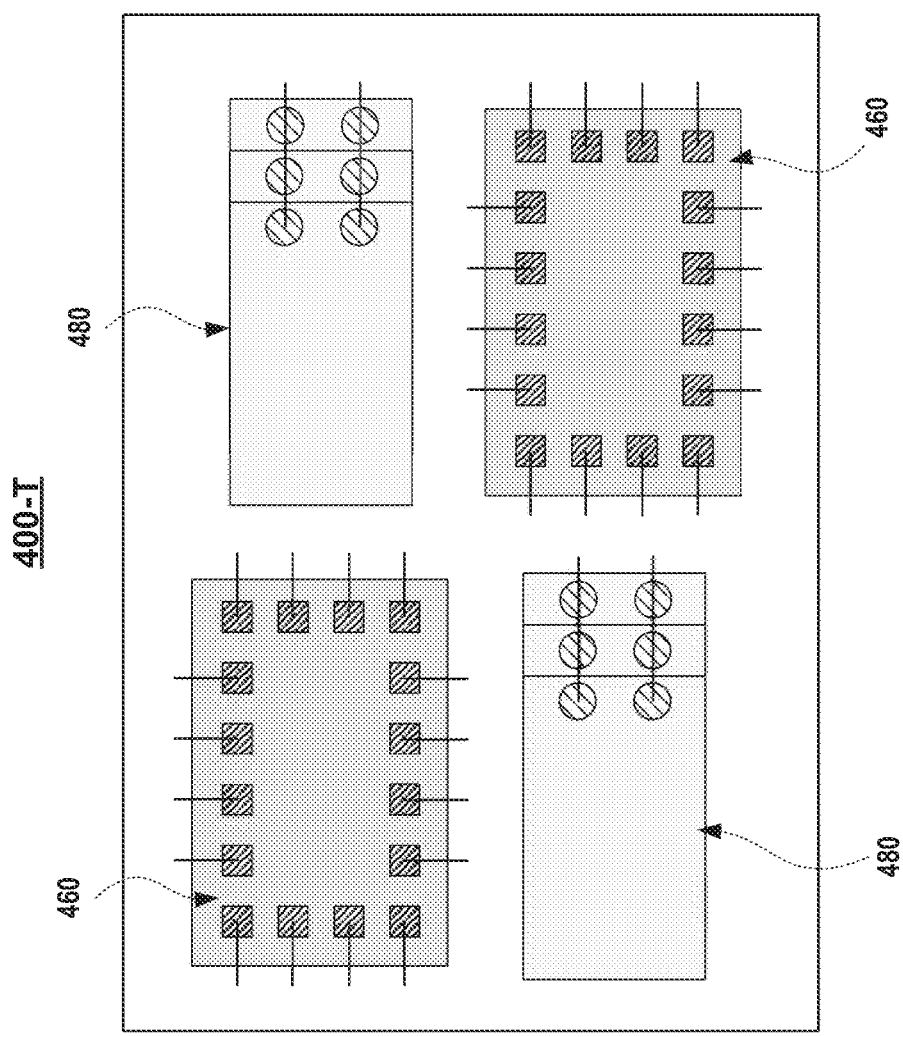
FIG. 4B illustrates a schematic diagram in a top view of an exemplary semiconductor device structure, in accordance with some embodiments of the present disclosure.

Referring to FIGS. 4A and 4B, schematic diagrams in a perspective side view and a top view of another example semiconductor device structure is illustrated, in accordance with some embodiments of the present disclosure. As shown in FIGS. 4A and 4B, the semiconductor device structure 400 can include one or more EMI shielding structures 460 and one or more die/die stacks 480 without EMI shielding located on a side of the one or more EMI shielding structures 460.

In some embodiments, the structure and fabricating process of the one or more EMI shielding structures 460 can be referred to the deceptions above in connection with FIGS. 1, 2A-2C, and 3. In some embodiments, the one or more die/die stacks 480 without EMI shielding can be formed simultaneously with the formation of the die/die stack 120 that requires EMI shielding. The signal wires 428 can be formed simultaneously with the formation of the signal wires 128 or the ground wires 138. In some other embodiments, the one or more die/die stacks 480 without EMI shielding can be formed before or after the formation of the die/die stack 120 and/or the conductive top block 130. In an example, the dies in the one or more die/die stacks 480 can be a three-dimensional NAND Flash device, and the die in the die/die stack 120 can be a memory controller for controlling the three-dimensional NAND Flash device.

Referring to FIG. 4B, two EMI shielding structures 460 are formed in the semiconductor device structure to protect two groups of dies/die stacks, and two die/die stacks 480 that have no EMI shielding requirements can be kept out of the EMI shielding structures. It is noted that, the numbers of EMI shielding structures 460 and die/die stacks 480 and the positions of EMI shielding structures 460 and die/die stacks 480 can be arranged and adjusted based on actual needs, which are not limited by FIG. 4B. In this example of FIGS. 4A and 4B, the one or more EMI shielding structures can be allocated partially in the finished package while keeping the rest portion for dies/die stacks which have no EMI shielding requirements to balance the needs between performance and cost.

Figure 5:
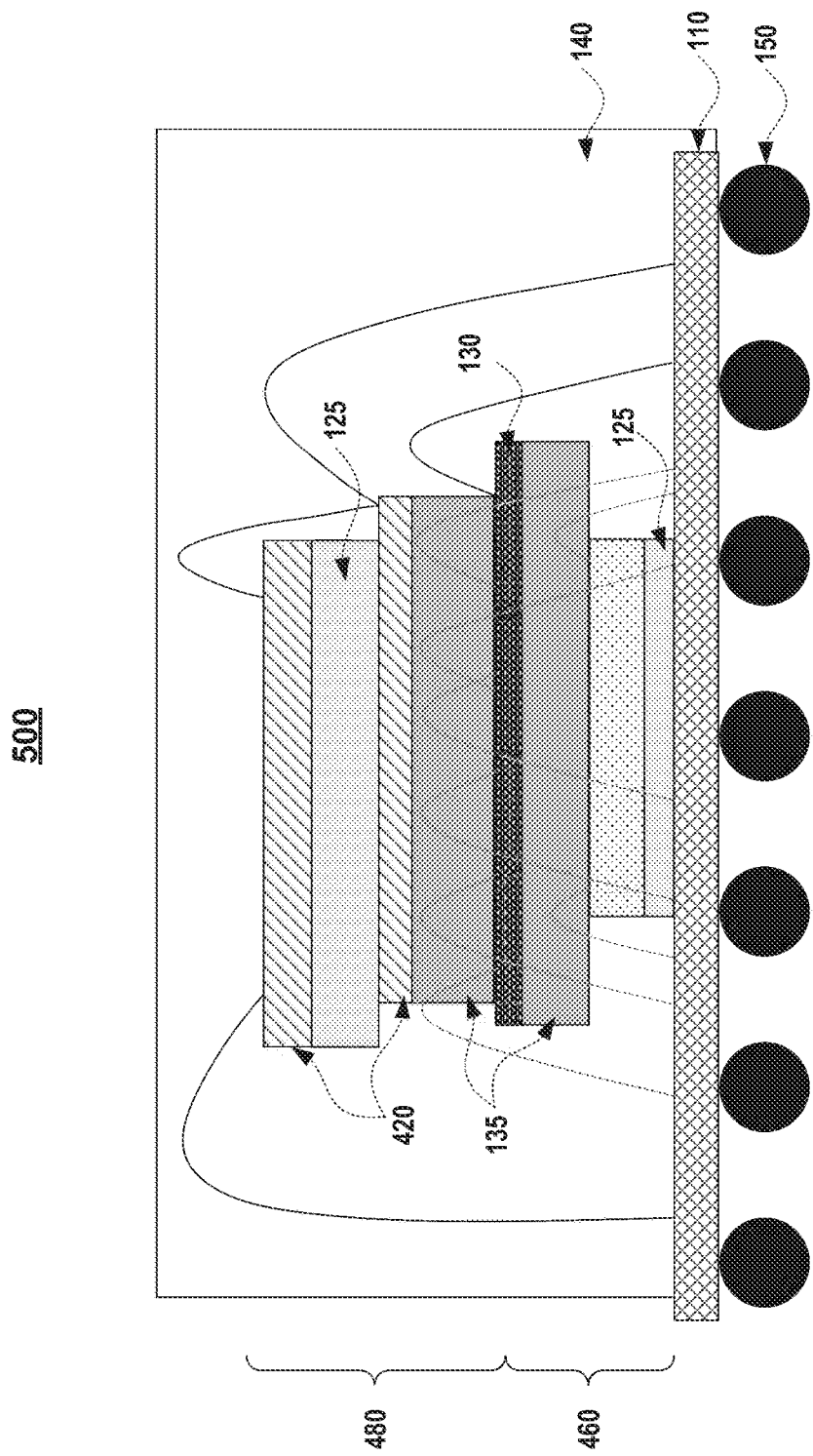
FIG. 5 illustrates a schematic diagram in a perspective side view of another exemplary semiconductor device structure, in accordance with some embodiments of the present disclosure.

Referring to FIG. 5, a schematic diagram in a perspective side view of another example semiconductor device structure is illustrated, in accordance with some embodiments of the present disclosure. Different from the example as shown in FIGS. 4A and 4B, in the semiconductor device structure 500 as shown in FIG. 5, a die/die stack 480 without EMI shielding can be formed on the top surface of an EMI shielding structure 460 to reduce the size of the semiconductor device structure 500 in a horizontal plane. It is noted that, one or more die 420 and conductive top block 130 can be attached to a lower layer by using film over wire (FOW) 135 to allow portions of signal wires or ground wires to penetrate through. In this design, the EMI shielding portion is placed at the bottom portion of the package while leveraging upper portion of the package for more die stacking, which can increase overall space utilization.

Accordingly, various embodiments of electromagnetic interference shielding package structures and their fabricating methods are disclosed. In the disclosed EMI package structures, a conductive top block can be formed on a die/die stack that requires EMI shielding. A plurality of ground wires can be formed to conductively connect the edges of the conductive top block and a base substrate. The conductive top block, the plurality of ground wires and the base substrate can form a Faraday cage to electromagnetically shield the die/die stack located within the Faraday cage. Since the Faraday cage is embedded within the package structure, it can be protected by mold compound layer of the package structure to avoid potential damages. In some embodiments, one or more die/die stacks 480 without EMI shielding can be formed on a side or on top of the conductive top block. The disclosed EMI shielding package structures can have a simple design and a low product cost.

One aspect of the present disclosure provides a semiconductor structure, comprising a first die/die stack attached on a substrate, a conductive top block covering a top surface of the first die/die stack. and a plurality of ground wires conductively connect the conductive top block and to the substrate. The conductive top block, the plurality of ground wires, and the substrate form a Faraday cage to provide an electromagnetic interference shielding of the first die/die stack.

In some embodiments, the plurality of ground wires are surrounding the first die/die stack.

In some embodiments, a size of the conductive top block is larger than a size of the first die/die stack in a plane substantially parallel to a major surface of the substrate, such that the top surface of the first die/die stack is completely covered by the conductive top block.

In some embodiments, the semiconductor structure further comprises a mold compound layer on the substrate and covering the conductive top block and the plurality of ground wires, and a plurality of solder balls attached to a bottom surface of the substrate.

In some embodiments, the conductive top block includes a conductive plate with a thickness between about 20 μm and about 100 μm, an insulating layer covering a top surface of the conductive plate, and a plurality of bond pads embedded in the insulating layer and in electrically contact with the conductive plate.

In some embodiments, the conductive plate is a metal plate or a conductive polymer plate doped with a metal or a metal oxide.

In some embodiments, the plurality of bond pads are located adjacent to all edges of the conductive top block, and have a thickness between about 0.5 μm and about 1 μm, and have a bond pad pitch between about 50 μm and about 5 mm.

In some embodiments, the conductive top block includes a conductive film on a top surface of a silicon wafer, wherein a thickness of the conductive film is in a range from about 1 μm to about 20 μm, an insulating layer covering a top surface of the conductive film, and a plurality of bond pads embedded in the insulating layer and in electrically contact with the conductive film.

In some embodiments, the conductive film is a metal film or a conductive ink film.

In some embodiments, the first die/die stack is attached to the substrate by a first adhesive film, and the conductive top block is attached to the top surface of the first die/die stack by a second adhesive film different from the first adhesive film.

In some embodiments, the first adhesive film is a die attach film, and the second adhesive film is a film over wire penetrated by a plurality of signal wires of the die/die stack.

In some embodiments, the semiconductor structure further comprises a second die/die stack without electromagnetic interference protection.

In some embodiments, the second die/die stack is located on a side of the first die/die stack in a lateral direction.

In some embodiments, the second die/die stack includes a three-dimensional NAND Flash device, and the first die/die stack includes a memory controller for controlling the three-dimensional NAND Flash device.

In some embodiments, the second die/die stack is located on a top surface of the conductive top block.

Another aspect of the present disclosure provides a method of forming a semiconductor structure, comprising: attaching a first die/die stack on a substrate; forming a conductive top block having a larger size of the first die/die stack; attaching the conductive top block to cover a top surface of the first die/die stack; and forming a plurality of ground wires conductively connect the conductive top block and the substrate, such that the conductive top block, the plurality of ground wires, and the substrate form a Faraday cage to provide an electromagnetic interference shielding of the first die/die stack.

In some embodiments, forming the plurality of ground wires comprising forming the plurality of ground wires surrounding the first die/die stack.

In some embodiments, the method further comprises: forming a mold compound layer on the substrate to cover the conductive top block and the plurality of ground wires; and attaching a plurality of solder balls to a bottom surface of the substrate.

In some embodiments, forming the conductive top block comprises: forming a conductive plate with a thickness between about 20 µm and about 100 µm; forming an insulating layer covering a top surface of the conductive plate; and forming a plurality of bond pads having a thickness between about 0.5 µm and about 1 µm embedded in the insulating layer and in electrically contact with the conductive plate.

In some embodiments, the method further comprises arranging the plurality of bond pads adjacent to all edges of the conductive top block, and having a bond pad pitch between about 50 µm and about 5 mm.

In some embodiments, the method further comprises: forming a conductive film having a thickness of the conductive film is in a range from about 1 µm to about 20 µm on a top surface of a silicon wafer by spin coating, spraying, plating, or sputtering; forming an insulating layer covering a top surface of the conductive film; and forming a plurality of bond pads having a thickness between about 0.5 µm and about 1 µm embedded in the insulating layer and in electrically contact with the conductive film.

In some embodiments, the method further comprises forming at least one signal wire connecting the first die/die stack to the substrate, wherein a portion of the at least one signal wire penetrates a second adhesive film for attaching the conductive top block.

In some embodiments, the method further comprises forming a second die/die stack located on a side of the first die/die stack in a lateral direction without electromagnetic interference protection.

In some embodiments, the method further comprises forming a second die/die stack located on a top surface of the conductive top block without electromagnetic interference protection.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor structure, comprising:
a first die/die stack attached on a substrate;
a conductive top block including a conductive material, the conductive material attached to semiconductor material at a top surface of the first die/die stack; and
a plurality of ground wires conductively connecting the conductive top block to the substrate;
wherein the conductive top block, the plurality of ground wires, and the substrate form a Faraday cage to provide electromagnetic interference shielding to the first die/die stack.

2. The semiconductor structure of claim 1, wherein:
the plurality of ground wires are surrounding the first die/die stack; and
a size of the conductive top block is larger than a size of the first die/die stack in a plane substantially parallel to a major surface of the substrate, such that the top surface of the first die/die stack is completely covered by the conductive top block.

3. The semiconductor structure of claim 1, further comprising:
a mold compound layer on the substrate and covering the conductive top block and the plurality of ground wires; and
a plurality of solder balls attached to a bottom surface of the substrate.

4. The semiconductor structure of claim 1, wherein the conductive material is a conductive plate having a thickness between about 20 µm and about 100 µm, the conductive top block includes:
an insulating layer covering a top surface of the conductive plate; and
a plurality of bond pads embedded in the insulating layer and in electrical contact with the conductive plate.

5. The semiconductor structure of claim 4, wherein:
the conductive plate is a metal plate or a conductive polymer plate doped with a metal or a metal oxide; and
the plurality of bond pads are located adjacent to edges of the conductive top block, the bond pads having a thickness between about 0.5 µm and about 1 µm, and the bond pads having a bond pad pitch between about 50 µm and about 5 mm.

6. The semiconductor structure of claim 1, wherein:
the first die/die stack is attached to the substrate by a first adhesive film; and
the conductive top block is attached to the top surface of the first die/die stack by a second adhesive film different from the first adhesive film.

7. The semiconductor structure of claim 6, wherein:
the first adhesive film is a die attach film; and
the second adhesive film is a film over wire penetrated by a plurality of signal wires of the first die/die stack.

8. The semiconductor structure of claim 1, wherein the Faraday cage is a first Faraday cage, the semiconductor structure further comprising a second die/die stack without a second Faraday cage.

9. The semiconductor structure of claim 8, wherein the second die/die stack is located on a side of the first die/die stack in a lateral direction.

10. The semiconductor structure of claim 8, wherein the second die/die stack includes a three-dimensional NAND Flash device, and the first die/die stack includes a memory controller to control the three-dimensional NAND Flash device.

11. The semiconductor structure of claim 8, wherein the second die/die stack is located on a top surface of the conductive top block.

12. A method of forming a semiconductor structure, comprising:
- attaching a first die/die stack on a substrate;
- forming a conductive top block having a size larger than the first die/die stack;
- attaching the conductive top block to cover a top surface of the first die/die stack;
- forming a plurality of ground wires to conductively connect the conductive top block and the substrate, such that the conductive top block, the plurality of ground wires, and the substrate form a first Faraday cage to provide electromagnetic interference shielding of the first die/die stack; and
- forming a second die/die stack located on a top surface of the conductive top block, the second die/die stack without the first Faraday cage and without a second Faraday cage.

13. The method of claim 12, further comprising:
- forming the plurality of ground wires surrounding the first die/die stack;
- forming a mold compound layer on the substrate to cover the conductive top block and the plurality of ground wires; and
- attaching a plurality of solder balls to a bottom surface of the substrate.

14. The method of claim 12, wherein forming the conductive top block comprises:
- forming a conductive plate with a thickness between about 20 μm and about 100 μm;
- forming an insulating layer covering a top surface of the conductive plate;
- forming a plurality of bond pads having a thickness between about 0.5 μm and about 1 μm embedded in the insulating layer and in electrical contact with the conductive plate; and
- arranging the plurality of bond pads adjacent to edges of the conductive top block, the plurality of bond pads having a bond pad pitch between about 50 μm and about 5 mm.

15. The method of claim 12, further comprising:
- forming a conductive film having a thickness in a range from about 1 μm to about 20 μm on a top surface of a silicon wafer by spin coating, spraying, plating, or sputtering;
- forming an insulating layer covering a top surface of the conductive film;
- forming a plurality of bond pads having a thickness between about 0.5 μm and about 1 μm embedded in the insulating layer and in electrical contact with the conductive film; and
- arranging the plurality of bond pads adjacent to edges of the conductive top block, the plurality of bond pads having a bond pad pitch between about 50 μm and about 5 mm.

16. The method of claim 12, further comprising:
- forming at least one signal wire connecting the first die/die stack to the substrate, wherein a portion of the at least one signal wire penetrates a second adhesive film to attach the conductive top block.

17. The method of claim 12, further comprising:
- forming a third die/die stack located on a side of the first die/die stack in a lateral direction without electromagnetic interference protection.

* * * * *